United States Patent [19]

Hirai et al.

[11] Patent Number: 4,695,717
[45] Date of Patent: Sep. 22, 1987

[54] SEMI-CONDUCTOR DEVICE AND ELECTRONIC APPARATUS USING THE SAME

[75] Inventors: Yutaka Hirai, Tokyo; Masahiro Haruta, Funabashi; Yukuo Nishimura, Sagamihara; Hiroshi Matsuda, Yokohama; Takashi Nakagiri, Tokyo, all of Japan

[73] Assignee: Canon Kabushiki Kaisha, Tokyo, Japan

[21] Appl. No.: 725,497

[22] Filed: Apr. 22, 1985

[30] Foreign Application Priority Data

Apr. 24, 1984 [JP] Japan .................................. 59-81091
May 16, 1984 [JP] Japan .................................. 59-96374
May 16, 1984 [JP] Japan .................................. 59-96372

[51] Int. Cl.⁴ .......................................... H01J 31/50
[52] U.S. Cl. .................................. 250/213 R; 313/386
[58] Field of Search ......................... 357/30; 250/213; 313/384, 386, 499, 500

[56] References Cited

U.S. PATENT DOCUMENTS

4,556,817 12/1985 Kusano et al. ...................... 313/386

Primary Examiner—Gene Wan
Attorney, Agent, or Firm—Fitzpatrick, Cella, Harper & Scinto

[57] ABSTRACT

A semi-conductor device comprising a lamination of a photoconductive layer, a charge-retaining layer and a display layer, provided between electroconductive films, and an electronic apparatus utilizing said semi-conductor device are provided.

15 Claims, 5 Drawing Figures

SEMI-CONDUCTOR DEVICE AND ELECTRONIC APPARATUS USING THE SAME

BACKGROUND OF THE INVENTION

1. Field of the Invention

This invention relates to a semi-conductor device, particularly a semi-conductor device of laminated structure for processing optical information, and to an electronic apparatus for displaying and recording according to information in the form of letters, images, etc., utilizing the said semi-conductor device.

2. Description of the Prior Art

In the conventional, multi-functional semi-conductor devices, for example, semi-conductor devices having sensor-display-driving functions, most suitable single crystals of inorganic materials are selected for the individual functions, but even in these cases there are still many problems, for example, in the heat resistance of substrate, crystallinity, lattice matching, cross-contamination between the materials, etc. No satisfactory performances can be obtained from the individual materials unless there is a good mutual compatibility between the materials. Furthermore, the single crystal is generally unsuitable for elements of large area.

Organic materials are functionally rich, easy to prepare and low in cost, but have problems in heat resistance and mechanical strength, and thus have not been in general use. However, recent technology has been producing new organic materials having various improved functions.

Some of the conventional, large electronic apparatus can perform displaying and recording at the same time, for example, according to a module system where a display device (for example, CRT) is connected to a recording device (for example, a thermal printer) through a signal line. However, the apparatus are inevitably large in size owing to the dual functions, and their applicable field has been restricted only to large scale office machines. Small and thin table-type electronic computers or language-learning machines using liquid crystal are available, but they have no other special functions than the computing function or language-learning function.

SUMMARY OF THE INVENTION

The present invention proposes to overcome the said problems. An object of the present invention is to provide a novel semi-conductor device in which the individual functional units are formed from at least one of organic materials and inorganic materials.

Another object of the present invention is to provide a thin and compact electronic apparatus.

The objects of the present invention can be attained according to any one of the following aspects of the present invention.

A first aspect of the present invention is to provide a semi-conductor device which comprises a laminated structure of a photoconductive layer, a charge-retaining layer are a display layer, the laminated structure being provided between two electroconductive films, at least one of which is transparent.

A second aspect of the present invention is to provide a semi-conductor device which comprises a laminated structure of a photoconductive layer, a charge-retaining layer and a display layer, the laminated structure being provided between two electroconductive films, at least one of which is transparent, and at least one of the photoconductive layer, the charge-retaining layer and the display layer being formed from a monomolecular layer or a monomolecular layers-built up film of organic material.

A third aspect of the present invention is to provide an electronic apparatus which comprises a laminated structure of an input unit, a processing unit for processing a signal from the input unit, and an output unit for outputting a signal from the processing unit.

A fourth aspect of the present invention is to provide an electronic apparatus which comprises a laminated structure of an input unit, a processing unit for processing a signal from the input unit, and an output unit for outputting a signal from the processing unit, at least one of the input unit, the processing unit and the output unit being formed from a monomolecular layer or a monomolecular layers-built up film.

DETAILED DESCRIPTION OF THE PREFERRED EMBODIMENTS

First of all, the outline of the present semi-conductor device will be described below.

In the present invention, a photoconductive layer, a charge-retaining layer for trapping an electric charge, and display layer for light emission or coloring under application of an electric field are formed each from a film of at least one of functional organic materials and-/or inorganic materials. Such film of at least one of organic and inorganic materials can be prepared by vapor deposition, CVD, polymerization under an electric field, or Langmuir-Blodgett's technique (which will be hereinafter referred to as LB process). A very thin film of inorganic material can be formed on a substrate by controlling atoms according to said vapor deposition or CVD, whereas a film of organic material can be formed on a substrate by controlling in the molecular order accroding to said vapor deposition, CVD, polymerization under an electric field or LB process.

In the present invention, the photoconductive layer, the charge-retaining layer for trapping an electric charge, and the display layer for light emission or coloring under application of an electric field are formed by lamination of corresponding functional layers, utilizing said film formation technique.

The following materials are selected for use in the present invention.

Material for the photoconductive layer is selected from amorphous Si:H, amorphous Si—C:H, CdS, CdSe, merocyanine dye or its derivatives, triphenylmethane dye or its derivatives, pyrene dye or its derivatives, and phthalocyanine dye or its derivatives. When the LB process is used as a film formation technique, dye derivatives having are alkyl chain having 10 to 18 carbon atoms as a hydropholic group are selected. Said material even containing B, P, Sb, As, F, I, Br, etc. as a dopant can be used for the photoconductive layer. The organic material specifically includes the following compounds:

Material for the charge-retaining layer is selected from amorphous Si—N:H, Si—C:H, SiO$_2$, Si—O, Si—O—N, and Cd or Ba salts of long chain saturated fatty acids such as arachidic acid, stearic acid, and the like.

Material for the display layer can be any material, so long as it can make light emission or coloring generally under application of an electric field, and is generally selected from materials for use in EC, LC, and EL, amorphous Si:H, amorphous Si—C:H, ZnS, ZnSe, anthracene and its derivatives, and spiropyrans.

In the present invention, a semi-conductor device of laminated structure is formed from said materials according to said film formation technique. It is possible to form a film of compound or mixture by depositing two different kinds of atoms or molecules onto a substrate at the same time by vapor deposition or CVD. Even by polymerization under an electric field or LB process a film of mixture of at least two different kinds of molecular can be formed by deposition from a solvent containing a mixture of the molecules. In that case, it is possible to electrically isolate functional molecules or atoms from one another by using a mixture of the functional molecules or atoms and insulating molecules or atoms.

In the case of organic materials, particularly LB process is preferable. According to the LB process, a uniform film having a thickness of one molecular length can be formed, and thus the device can be readily made thinner. The film area can be also adjusted between a small area and a large area in accordance with the size of substrate without any substantial limitation. According to the LB process, the molecular distribution in the film is so uniform that highly accurate display can be made.

In a laminated structure formed from different kinds of materials according to said film formation technique, molecular or atomic layers each having different functions are arrayed, as connected to one another, vertically to the substrate while the respective molecules or atoms are electrically isolated from one another in parallel to the substrate, and thus the functions of a multifunctional semi-conductor device can be fully performed.

The present semi-conductor device will be described below, referring to the drawing.

Figure 1:
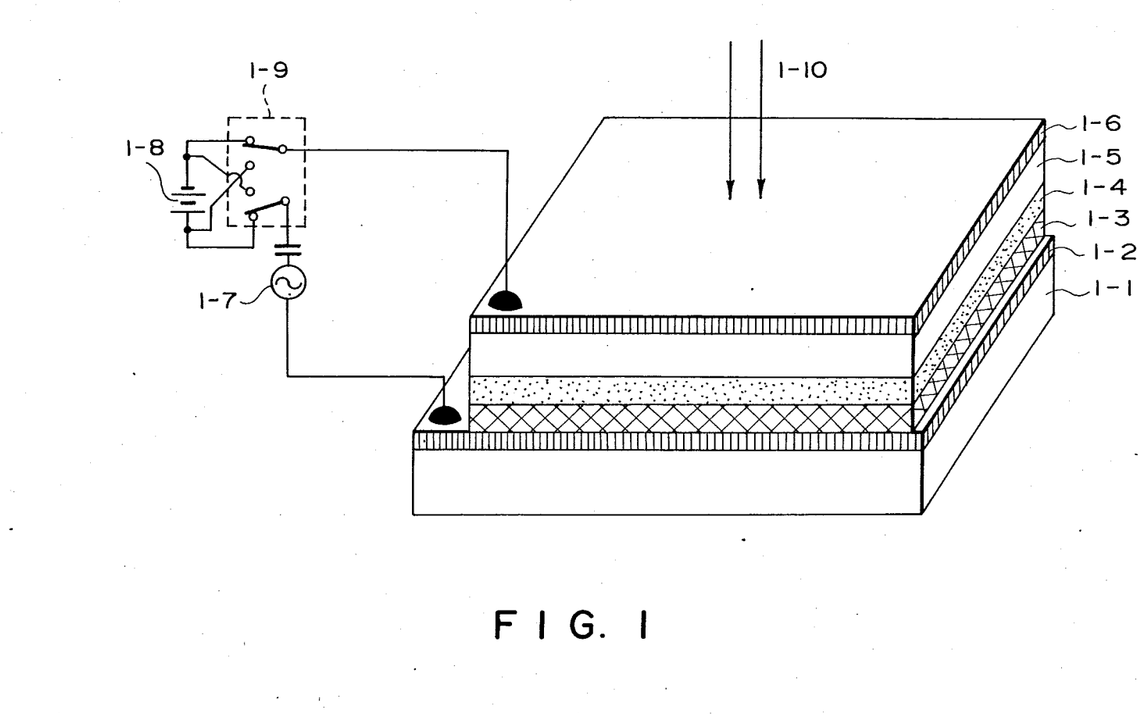
FIG. 1 is a structural view including the sectional structure of a semi-conductor device according to one embodiment of the present invention.

FIG. 1 is a perspective view showing the cross-sectional structure of a semi-conductor device according to one embodiment of the present invention, where numeral 1-1 is a transparent substrate, 1-2 a transparent electroconductive film, 1-3 a display film, 1-4 a trap layer, 1-5 a photoconductive layer, and 1-6 a transparent electroconductive film, all of these members being integrated into a laminated structure. Display layer 1-3 can be exchanged with photoconductive layer 1-5 in their positions.

Working of the embodiment will be described below.

An AC voltage superposed on a DC bias by a DC source 1-8 and an AC source 1-7 is applied to the electroconductive films 1-2 and 1-6 as electrodes. The peak of AC voltage is made substantially equal to that of DC bias, and thus no effective AC voltage is applied to the display layer 1-3 in this state, and no light emission is made. When an incident light 1-10 is irradiated on the transparent electroconductive film 1-6, a carrier is generated in the photoconductive layer 1-5, and migrated under the DC electric field and injected into the charge-retaining layer 1-4 and trapped. The trapped carrier becomes a space charge and acts to cancel the applied DC bias. At this site, the display layer 1-3 is brought into the state of effective AC application to make light emission.

Blanking is carried out by applying a DC bias in a reversed direction or by irradiating a light on the entire surface while applying a DC bias in a reversed direction, and sweeping the carrier from the chargeretaining layer. When the display layer 1-3 is a built up film formed from a mixture of molecules having different spectral peaks of light emission, molecules of different spectral peaks of light emission can emit the light by changing the magnitude of AC bias, depending on light input 1-10, and thus color display can be realized.

An electronic apparatus using said semi-conductor device will be described below, referring to the drawing.

Figure 2:
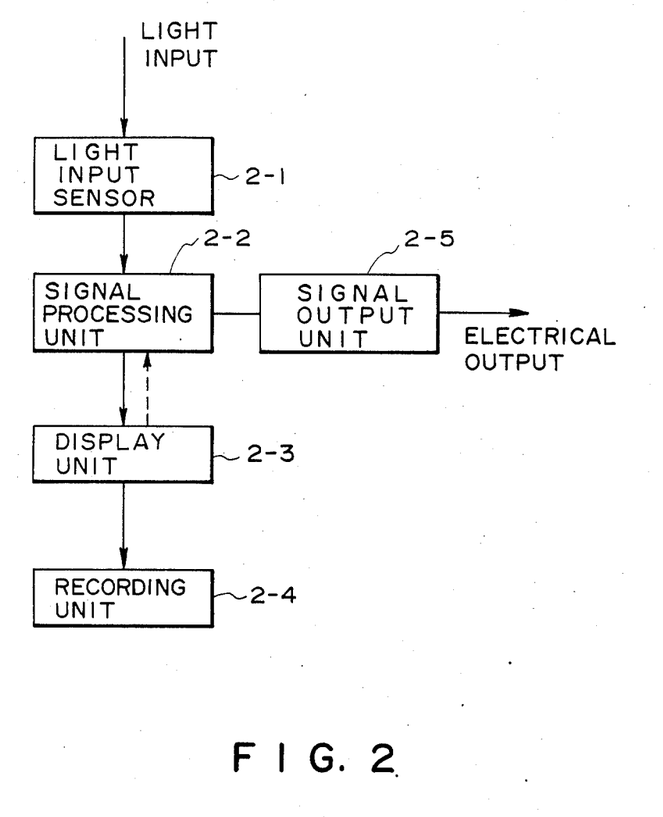
FIG. 2 is a block diagram showing the schematic structure of a thin electronic apparatus according to another embodiment of the present invention.

FIG. 2 is a block diagram showing a schematic structure of a thin electronic apparatus according to another embodiment of the present invention, wherein numeral 2-1 is a light input sensor unit for detecting light input information and converting it into an electric signal, 2-2 a signal processing unit for processing the electric signal from the light input sensor unit 2-1, 2-3 a display unit for making display corresponding to the light input information upon receipt of the signal from the signal processing unit 2-2, 2-4 a recording unit for recording an image displayed upon receipt of the light signal from the display unit 2-3, and 2-5 a signal output unit (transmission unit) for transmitting the output from the display unit 2-3 through the signal processing unit 2-2, or the signal from the signal processing unit directly to other system as an electric signal. The display unit 2-3, recording unit 2-4 or signal output unit 2-5 may be hereinafter referred to merely as output unit.

Function of each unit will be described below.

The light input sensor unit 2-1 functions to detect the light, for example, from a pen-shaped light input means that can emit a light by pressing and to convert it into an electric signal.

The signal processing unit 2-2 functions to store the electric signal from the light input sensor unit 2-1, to output a signal to the display unit 2-3, when desired, to display image information and also transmit an output signal to other system through the signal output unit 2-5.

The display unit 2-3 functions to output the electric signal stored in the signal processing unit 2-2 as an image and to make display corresponding to the light input information. Function of recording unit 2-4 is to be sensitized by a light from the display unit 2-3 and to record its light image.

The signal output unit 2-5 functions to detect the polarized state of signal processing unit 2-2 and to transmit it as an electric signal to an external shift register.

The signal output unit has wirings in a matrix state so as to detect the polarized state of the signal processing unit, where one wiring width is about 10 to about 100 times that of molecule.

The light input sensor unit 2-1, signal processing unit 2-2, display unit 2-3, and recording unit 2-4 can be formed from a monomolecular layer or a monomolecular layers-built up film, for example, according to the well known LB process (Jikken Kagaku Koza (Experimental Chemistry Series), Vol. 18, pages 489–507, published by Maruzen Publishing Co., Tokyo), or according to other technique than the LB process, for example, by vapor deposition or CVD.

In the present invention, at most three kinds or at least one kind of functional molecular layers are arranged in a vertical direction to the films, and transfer of signals takes place between the films. To prevent any signal leakage in a parallel direction to the films in this case, insulating molecular such as long chain saturated fatty acid, etc. are mixed with said functional molecules. Trap sites of long chain saturated fatty acid as the polarizing molecules in the signal processing unit 2-2 can be also readily and regularly arranged according to the LB process.

Thus, a system containing a light input sensor unit, a signal processing unit and a display unit can be integrally formed by lamination according to the LB process. Accordingly, the present invention can simplify the forming process and make available the film-formed and compact apparatus, as compared with the conventional art of connecting functionally independent units to one another by metal wiring or the like. The recording unit can be also formed in a sheet form, and if the display light can be recorded at a position as near the display unit as possible, the entire system can be formed into a more compact film.

Figure 3:
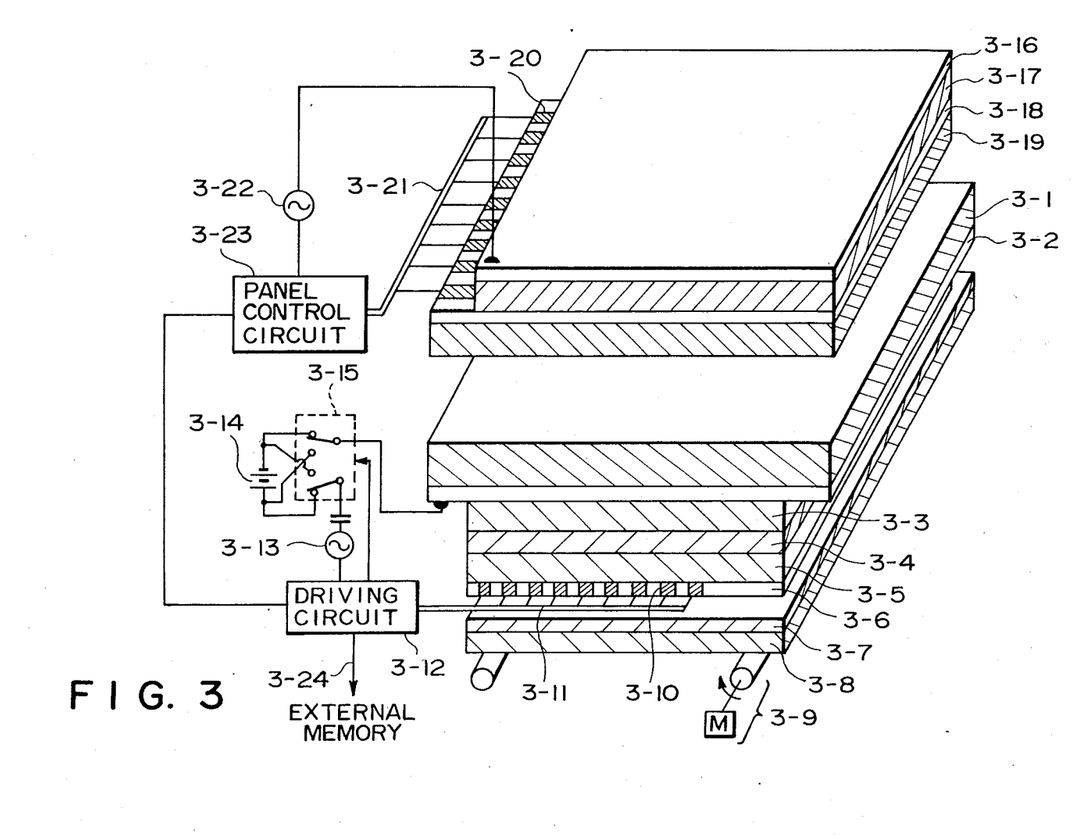
FIG. 3 is a detailed structural view including the cross-sectional structure of a thin electronic apparatus according to other embodiment of the present invention.

FIG. 3 is a detailed structural view including the cross-sectional structure of a thin electronic apparatus according to other embodiment of the present invention. The structure and working of the embodiment will be described below, referring to the drawing.

Numeral 3-1 is a transparent substrate, 3-2 a transparent electrode formed on the entire surface of substrate 3-1, 3-3 a light sensor input molecular layer, 3-4 a charge-retaining layer as a signal processing unit, and 3-5 a display molecular layer. These layers are formed, as laid upon one another, according to the LB process. 3-6 is stripe-formed transparent electrodes formed thereon. 3-10 is take-out electrode ends (signal output units) which are connected to a driving circuit 3-12 for display through the respective take-out wirings 3-11.

3-13 is a AC power source, 3-14 a DC power source, and by switching of switch circuit 3-15, a AC signal superposed on a positive DC bias voltage or an AC signal superposed on a negative DC bias voltage can be applied between the transparent electrodes 3-2 and 3-6.

3-12 is the driving circuit that controls the switching of switch circuit 3-15, and detects the discharge current from the take-out wirings 3-11 and output it to an external memory through a wiring 3-24.

3-7 is a molecular layer for recording, integrally formed on the sheet substrate 3-8 according to the LB process, and 3-9 is a recording sheet driving unit.

3-19 is a transparent substrate, and 3-18 stripe-formed, transparent electrodes on the substrate 3-19, the direction of transparent electrodes 3-18 being cross that of transparent electrodes 3-6 at the right angle. 3-17 is a luminous layer, formed according to the LB process. 3-16 is a transparent electrode. All of these members are integrally formed, and will be hereinafter referred to as "panel" on the whole. 3-20 is take-out electrode ends of transparent electrodes 3-18, which are connected to a panel control circuit 3-23 through take-out wirings 3-21. The panel control circuit 3-23 controls an AC power source 3-22 and applies an AC voltage between the transparent electrodes 3-16 and 3-18 to make light emission at the luminous layer 3-17. The panel control circuit 3-23 is electrically connected to the driving circuit 3-12, and the timing for voltage application and scanning of the respective stripe-formed electrodes 3-18 on the panel side is in an appropriate agreement with the read-out timing of the respective stripe-formed electrodes 3-6 on the display side.

When flexible, for example, plastic members are used for the substrates 3-1 and 3-19, the respective functional molecular layers can be made also flexible, because the respective molecular layers have a very small thickness, and accordingly, the entire electronic apparatus can be made flexible.

Working of this embodiment will be described below.

At first, an AC voltage superposed on a DC bias by the DC power source 3-14 and the AC power soruce 3-13 is applied to both electrodes 3-2 and 3-6. Since the peak of AC voltage is made substantially equal to that of DC bias, no effective AC voltage is applied to the display molecular layer 3-5 in this state, and no light emission takes place. Reversed directional voltage is applicable, but no current is made to flow, even in this case, by a rectifying means, not shown in the drawing, and thus no light emission takes place, either. When an incident light is irradiated on the substrate 3-1, for example, by an input pen, a carrier is generated in the light sensor input molecular layer, and migrated under the DC electric field and injected and trapped in the charge-retaining layer. The trapped carrier becomes a space charge and acts to cancel the applied DC bias. At this site, the output display molecular layer 3-5 is brought into the state of effective AC application to make light emission.

Blanking is carried out by switching the switch 3-15 to apply the DC bias in a reversed direction, thereby sweeping the carrier from the charge-retaining layer. When the output display molecular layer 3-5 is a built-up film formed from a mixture of molecules having different spectral peaks of light emission under an AC voltage, molecules of different spectral peaks of light emission can trap the carrier or emit light by changing the magnitude of AC voltage, depending on a light input, and thus color display can be made.

In the case of recording, a recording sheet having a recording molecular layer on the recording sheet substrate 3-8 in approached to the lower side of transparent electrode 3-6, and then a photochromic change is caused on the recording molecular layer by the light from the light-emitting output display molecular layer 3-5 and recorded thereon. Charging and discharging of the recording sheet are carried out by a recording sheet driving unit 3-9.

To transfer displayed information to an external memory, the substrate 3-19 is approached to the substrate 3-1 by moving the panel. Then, an AC voltage is successively applied to the stripe-formed transparent electrodes 3-18 from one end towards another by the AC power source 3-22 to make the luminous layer 3-17 emit light. Upon receipt of the light, the resistance of light sensor input molecular layer 3-3 is lowered, and the charge on the charge-retaining layer is discharged. The driving circuit 3-12 successively detects the passing current through the stripe-formed transparent electrodes 3-6, and the detected signal information is passed to the external memory through the wiring 3-24.

Blanking of the display is carried out in the similar working manner with the only exception that no signal information is transferred to the memory.

Figure 4A:
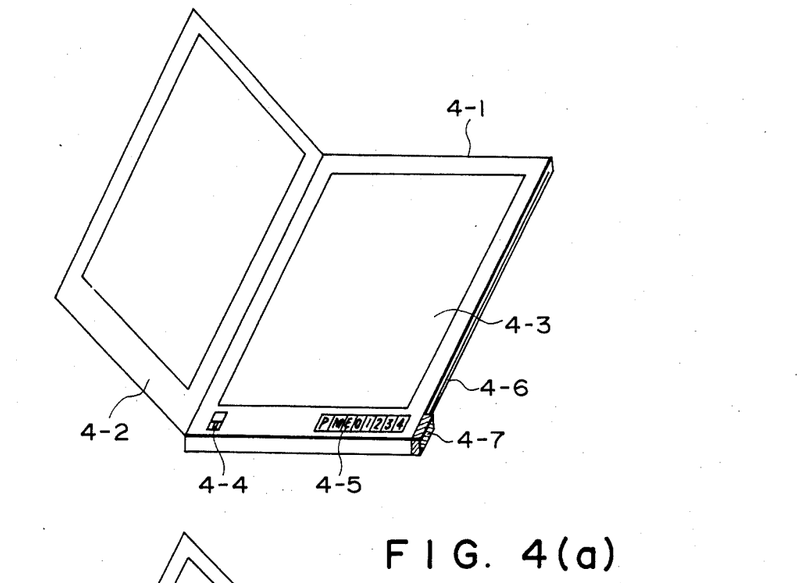
FIGS. 4(a) and (b) are schematic views of a thin electronic apparatus according to further concrete embodiment of the present invention.
Figure 4B:
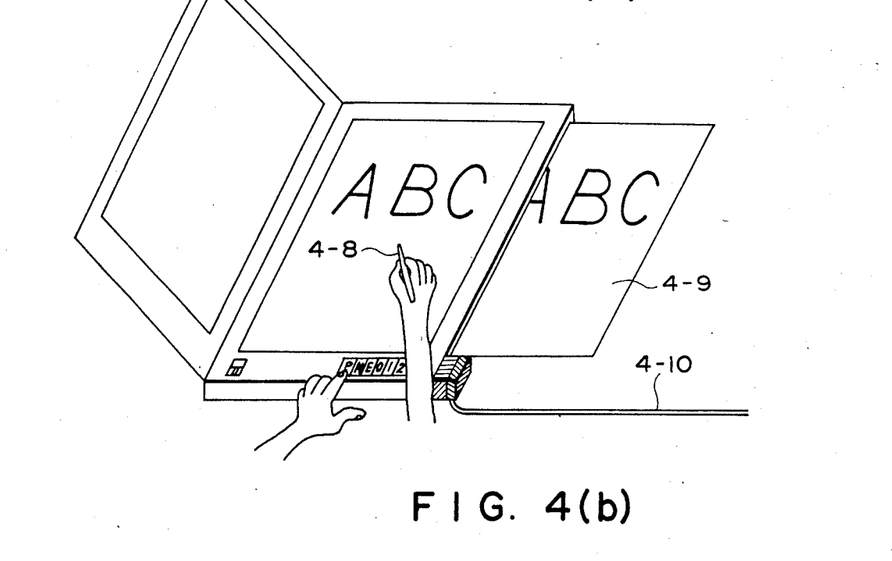

FIGS. 4(a) and (b) are schematic views of a thin electronic apparatus in a note book form according to further concrete embodiment of the present invention. The size of apparatus body 4-1 is 360 mm long, 250 mm wide and 15 mm thick, the size of display part is 250 mm long and 170 mm wide, and the paper storing capacity is 25 sheets. Under a cover, there are a display panel 4-3 on the front face and operating button switches 4-5 at the bottom of the front face [FIG. 4(a)].

At first, a power switch 4-4 connected to a flat electric cell incoporated inside is pushed to turn on the power. Then, after pushing the display switch, a desired image is drawn on the display panel by an input pen 4-8, whereby the image is displayed as drawn, and the displayed state is retained [FIG. 4(b)]. To obtain a hard copy of the displayed image, the print switch is pushed, and then the written information is printed on paper 4-9, which is discharged from paper outlet 4-6. To store the written information into an external memory, a connector 4-7 is connected to any desired memory device (magnetic disk, semi-conductor memory, magnetic tape, etc.) through a line 4-10. Then, a panel 4-2 is laid on the display panel 4-3, and the memory switch is pushed. Then, stripe-formed light is successively scanned from the panel 4-2 to carry out blanking and memory input into the external memory device at the same time.

Preparation of semi-conductor devices according to embodiments of the present invention will be described in detail below. Example 1 shows an embodiment of preparing the device only from inorganic materials. Example 2 an embodiment of preparing the charge-retaining layer 1-3 and the display layer 1-4 from organic materials, and Example 3 an embodiment of preparing the photoconductive layer also from organic materials.

EXAMPLE

A 1,000 Å-thick insulating layer is formed onto a 1,000 Å-thick transparent electrode (ITO) film formed on a glass substrate (20 mm square and 0.8 mm thick) by vapor deposition of SiO. Then, an amorphous SiC layer is formed thereon as a display layer. That is, the substrate is placed in a vacuum chamber and the substrate temperature is kept at 100° C. Then, dimethylsilane gas (concentration: 10% by volume; diluted with hydrogen) is introduced onto the substrate at 100 SCCM, while adjusting the pressure to 5 Torr, and decomposed under the light (power: 100 W/cm$^2$) of Hg lamp (254 nm) to obtain a SiC:H film having a thickness of 2,000 Å.

Then, a charge-retaining layer and a photoconductive layer are successively formed by glow discharge. That is, the substrate temperature is kept at 100° C., and a gas of SiH$_4$ (concentration: 10% by volume; diluted with hydrogen)/NH$_3$ (pure) of 5:1 by mole is intorduced onto the substrate at 50 SCCM, and deposited thereon to a thickness of about 1,000 Å under a pressure of 0.1 Torr and a power of 5 W (electrode area: 800 cm$^2$). Then, a gas of SiH$_4$ (concentration: 10% by mole; diluted with hydrogen) is introduced onto the substrate at 20 SCCM, and deposited thereon to a thickness of about 3,000 Å under a pressure of 0.1 Torr and a power of 2 W.

Then, a 1,000 Å transparent electrode (ITO) is formed thereon by electron beam vapor deposition in the same manner as above.

EXAMPLE 2

Amorphous Si:H is deposited as a photoconductive layer onto a 1,000 Å-thick transparent electrode (ITO) film formed on a glass substrate (20 mm square and 0.8 mm thick). That is, SiH$_4$ (concentration: 10%; diluted with hydrogen) is introduced onto the substrate and deposited to a thickness of about 2,500 Å under a pressure of 0.1 Torr and a power of 2 W.

Then, a charge-retaining layer and a display layer are successively deposited thereon according to the LB process. That is, an arachidic acid solution in chloroform (concentration: $5 \times 10^{-3}$ mol/l) is spread on an aqueous CdCl$_2$ solution (concentration: $3 \times 10^4$ mol/l, pH6), and 100 layers thereof are built up on the amorphous Si layer on the substrate under a surface pressure of 35 dynes/cm at a pulling speed of 5 cm/min. Then, the aqueous CdCl$_2$ solution is adjusted to a concentration of $2.5 \times 10^{-4}$ mol/l and pH 4.5, and 150 layers of an anthracene derivative are built up likewise thereon under a surface pressure of 15 dynes/cm at a pulling speed of 0.5 cm/min. Finally, Au is deposited thereon as a transparent electrode to a thickness of 50 Å.

EXAMPLE 3

Merocyanine having the following formula is deposited to a thickness of about 200 Å as a photoconductive layer onto a 1,000 Å-thick transparent electrode (ITO) film formed on a glass substrate (20 mm square and 0.8 mm thick) by evaporation at 250° C. in vacuum of $1 \times 10^{-6}$ Torr.

Then, arachidic acid is vaporized in vacuum and deposited to a thickness of about 500 Å as a charge-retaining layer thereon. Then, anthracene is vaporized in vacuum and deposited to a thickness of 3,000 Å as a display layer thereon. Then, an Au electrode is deposited to a thickness of 50 Å thereon by vacuum vapor deposition.

In the foregoing Examples 1, 2 and 3, a power source is connected to both electrodes at the ends through lead wires to apply a DC voltage of 15 V thereto. When a voltage of 1 KHz 15 V (p-p) is further applied thereto with irradiation of a He-Ne laser beam at a power of 100 $\mu W/cm^2$ at the same time, only the irradiated parts can emit light to perform the display function.

As described above, the respective functional layers of the present semi-conductor device are appropriately formed from at least one of inorganic and organic materials, to fully utilize the performances of inorganic and organic materials, and thus good performances can be effectively obtained throughout the entire semi-conductor device.

In the present electronic apparatus, the respective functional units, i.e., an input unit, a signal processing unit, and an output unit, are integrally formed into a very thin structure by lamination, and thus an electronic apparatus having a multi-function, for example, input, display, processing, recording, transfer, blanking, etc. can be prepared in a much compact size. The present electronic apparatus can be applied to office or home electronic apparatuses requiring simplicity and portability, and office handling and learning can be efficiently made thereby.

We claim:

1. A display device which comprises a laminated structure of a photoconductive layer, a charge-retaining layer and a display layer which are provided between two electrophotoconductive films, the charge-retaining layer being provided between the photoconductive layer and the display layer, at least one of the two electroconductive films being transparent.

2. A display device according to claim 1, wherein the photoconductive layer is formed from one of amorphous si:H, amorphous Si—C:H, CdS, CdSe, merocyanine dye and its derivatives, triphenylmethane dye and its derivatives, pyrene dye and its derivatives, and phthalocyanine dye and its derivatives.

3. A dispaly device according to claim 1, wherein the charge-retaining layer is formed from one of amorphous Si—N:H, amorphous Si—C:H, $SiO_2$, Si—O, Si—O—N, and Cd and Ba salts of long chain saturated fatty acids.

4. A display device according to claim 1, wherein the display layer is formed from one of amorphous Si:H, amorphous Si—C:H, ZnS, ZnSe, anthracene and its derivatives, and spiropyranes.

5. A display device according to claim 1, further including means for applying AC voltage superimposed on a DC bias between the two electroconductive films.

6. A display device which comprises a laminated structure of a photoconductive layer, a charge-retaining layer and a display layer, provided between two electroconductive films, at least one of which is transparent, and at least one of the photoconductive layer, the charge-retaining layer and the display layer being formed from a monomolecular layer or a monomolecular layers-built up film of organic material.

7. A display device according to claim 6, wherein the photoconductive layer is formed from one of amorphous Si:H, amorphous Si—C:H, CdS, CdSe, merocyanine dye and its derivatives, triphenylmethane dye and its derivatives, pyrene dye and its derivatives, and phthalocyanine dye and its derivatives.

8. A display device according to claim 6, wherein the charge-retaining layer is formed from one of amorphous Si-N:H, amorphous Si—C:H, $SiO_2$, Si—O, Si—O—N and Cd and Ba salts of long chain saturated fatty acids.

9. A display device according to claim 6, wherein the display layer is formed from one of amorphous Si:H, amorphous Si-C:H, ZnS, ZnSe, anthracene and its derivatives, and spirophranes.

10. A display device according to claim 1, further including a recording unit provided in proximity to the dispaly layer.

11. A display device according to claim 5, wherein the recording unit is formed in a sheet form.

12. A display device according to claim 6, further including a recording unit provided in proximity to the display layer.

13. A display divice according to claim 12, wherein the recording unit is formed in a sheet form.

14. A display device according to claim 1, further including an output unit for transmitting displayed information to an external memory.

15. A display device according to claim 6, further including an output unit for transmitting displayed information to an external memory.

* * * * *

UNITED STATES PATENT AND TRADEMARK OFFICE
CERTIFICATE OF CORRECTION

PATENT NO. : 4,695,717
DATED : September 22, 1987
INVENTOR(S) : YUTAKA HIRAI, ET AL.

It is certified that error appears in the above-identified patent and that said Letters Patent is hereby corrected as shown below:

COLUMN 1

Line 39, "large scale" should read --large-scale--.
Line 60, "are" should read --and--.

COLUMN 2

Line 3, "layers-built up" should read --layers-built-up--.
Line 17, "layers-built up" should read --layers-built-up--.
Line 31, "to further" should read --to a further--.
Line 53, "accroding" should read --according--.

COLUMN 3

Line 1, "are" should read --an--.
Line 2, "hydropholic" should read --hydrophilic--.
Line 46, "spiropyrans." should read --spiropyranes.--.
Line 55, "molecular" should read --molecules--.

COLUMN 4

Line 18, "display film," should read --display layer,--.
Line 43, "chargeretaining" should read --charge-retaining--.
Line 44, "built up" should read --built-up--.

COLUMN 5

Line 18, "information. Function" should read --information. ¶ Function--.
Line 31, "layers-built up" should read --layers-built-up--.
Line 32, "well known" should read --well-known--.

UNITED STATES PATENT AND TRADEMARK OFFICE
CERTIFICATE OF CORRECTION

PATENT NO. : 4,695,717

DATED : September 22, 1987

INVENTOR(S) : YUTAKA HIRAI, ET AL.

It is certified that error appears in the above-identified patent and that said Letters Patent is hereby corrected as shown below:

COLUMN 5 (continued)

Line 33, close up right margin.
    Line 34, close up left margin.
    Line 43, "molecular" should read --molecules--.

COLUMN 6

Line 8, "a" (first occurrence) should read --an--.
    Line 15, "output" should read --outputs--.
    Line 48, "soruce" should read --source--.

COLUMN 7

Line 9, "in" should read --is--.
    Line 33, "note book" should read --notebook--.
    Line 42, "incoporated" should read --incorporated--.
    Line 65, "1-3" should read --1-4-- and "1-4" should read --1-3--.

COLUMN 8

Line 2, "EXAMPLE" should read --EXAMPLE 1--.
    Line 21, "intor-" should read --intro----.

COLUMN 9

Line 37, "much" should read --very--.
    Line 40, delete "office".

UNITED STATES PATENT AND TRADEMARK OFFICE
CERTIFICATE OF CORRECTION

PATENT NO. : 4,695,717

DATED : September 22, 1987

INVENTOR(S) : YUTAKA HIRAI, ET AL.

It is certified that error appears in the above-identified patent and that said Letters Patent is hereby corrected as shown below:

COLUMN 10

Line 3, "dispaly" should read --display--.
Line 21, "layers-built up" should read --layers-built-up--.
Line 36, "spirophranes." should read --spiropyranes.--.
Line 39, "dispaly" should read --display--.
Line 45, "divice" should read --device--.

Signed and Sealed this

Twenty-second Day of March, 1988

Attest:

DONALD J. QUIGG

Attesting Officer

Commissioner of Patents and Trademarks